United States Patent
Kolesnychenko et al.

(10) Patent No.: US 7,692,771 B2
(45) Date of Patent: Apr. 6, 2010

(54) IMPRINT LITHOGRAPHY

(75) Inventors: Aleksey Yurievich Kolesnychenko, Helmond (NL); Helmar Van Santen, Amsterdam (NL); Yvonne Wendela Kruijt-Stegeman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 936 days.

(21) Appl. No.: 11/138,899

(22) Filed: May 27, 2005

(65) Prior Publication Data

US 2006/0268256 A1 Nov. 30, 2006

(51) Int. Cl.
  G03B 27/02 (2006.01)
  G03B 27/20 (2006.01)
(52) U.S. Cl. .......................... 355/78; 355/91
(58) Field of Classification Search ............. 355/78, 355/91; 438/689, 694; 430/22; 264/401, 264/407; 356/369
  See application file for complete search history.

(56) References Cited

U.S. PATENT DOCUMENTS

| | | | |
|---|---|---|---|
| 3,970,097 A | 7/1976 | Voellmy et al. | |
| 4,989,984 A | 2/1991 | Salinger | |
| 5,082,371 A | 1/1992 | Ansari | |
| 5,512,131 A | 4/1996 | Kumar et al. | 156/655.1 |
| 5,608,526 A * | 3/1997 | Piwonka-Corle et al. | 356/369 |
| 5,754,269 A | 5/1998 | Benjamin et al. | |
| 5,772,905 A | 6/1998 | Chou | 216/44 |
| 6,165,911 A | 12/2000 | Calveley | 438/754 |
| 6,181,770 B1 | 1/2001 | Ciravolo et al. | |
| 6,303,925 B1 | 10/2001 | Edmonds | |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,548,423 B1 | 4/2003 | Plat et al. | |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,921,615 B2 | 7/2005 | Sreenivasan et al. | 430/22 |
| 7,405,147 B2 | 7/2008 | Edelstein et al. | |
| 7,407,737 B2 | 8/2008 | Meisel et al. | |
| 2002/0093122 A1 | 7/2002 | Choi et al. | 264/401 |

(Continued)

FOREIGN PATENT DOCUMENTS

JP  2004-505273 T  2/2004

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner*—Peter B Kim
(74) *Attorney, Agent, or Firm*—Pillsbury Winthrop Shaw Pittman, LLP

(57) ABSTRACT

A lithographic apparatus is disclosed that has a template holder configured to hold an imprint template, a substrate table arranged to receive a substrate, a radiation output arranged to illuminate a part of the imprint template, and a detector configured to detect radiation scattered from an interface between the imprint template and imprintable material provided on the substrate.

16 Claims, 7 Drawing Sheets

U.S. PATENT DOCUMENTS

| | | | |
|---|---|---|---|
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0050816 A1* | 3/2004 | Asakawa et al. | 216/2 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0168586 A1 | 9/2004 | Bailey et al. | 101/3.1 |
| 2004/0169003 A1 | 9/2004 | Lee et al. | 216/4 |
| 2004/0184953 A1 | 9/2004 | Litzie et al. | |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0023434 A1 | 2/2005 | Yacoubian | |
| 2005/0037143 A1* | 2/2005 | Chou et al. | 427/248.1 |
| 2005/0039618 A1 | 2/2005 | Heidari et al. | 101/368 |
| 2005/0064054 A1 | 3/2005 | Kasumi | 425/112 |
| 2005/0067379 A1 | 3/2005 | Sreenivasan et al. | 216/44 |
| 2006/0147820 A1* | 7/2006 | Colburn et al. | 430/22 |
| 2007/0012867 A1 | 1/2007 | Wolters et al. | |
| 2007/0018360 A1 | 1/2007 | Kolesnychenko et al. | |
| 2007/0248300 A1 | 10/2007 | Dickopf et al. | |
| 2008/0026464 A1 | 1/2008 | Borenstein et al. | |
| 2008/0105978 A1 | 5/2008 | Schmitt et al. | |
| 2008/0128631 A1 | 6/2008 | Suhami | |

FOREIGN PATENT DOCUMENTS

| | | | |
|---|---|---|---|
| JP | 2004-259985 A | 9/2004 | |
| JP | 2005-116978 A | 4/2005 | |
| JP | 2007-140460 A | 6/2007 | |
| WO | WO 01/79591 A1 | 10/2001 | |
| WO | WO 01/79592 A1 | 10/2001 | |
| WO | WO 2004/013693 A2 | 2/2004 | |
| WO | WO 2004/013693 A3 | 2/2004 | |
| WO | WO 2004/016406 A1 | 2/2004 | |
| WO | WO 2004/055594 A2 | 7/2004 | |
| WO | WO 2004/055594 A3 | 7/2004 | |

OTHER PUBLICATIONS

English translation of Notice of Reasons for Rejection for Japanese Patent Application No. 2006-146630 dated Apr. 30, 2009.
http://web.archive.org/web/20040622191950/www.humboldt.edu/~scimus/HSC.54-70/Descriptions/Spec20.htm (undated as provided to Applicant by the USPTO).
Use of the Bausch and Lomb Spectronic 20 Colorimeter.

* cited by examiner

IMPRINT LITHOGRAPHY

1. FIELD

The invention relates to imprint lithography.

2. BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

In a conventional imprint lithography apparatus, a template provided with a pattern is attached to an actuator. The actuator moves the template towards a substrate, and pushes the template onto the substrate. The forces pushing onto the substrate via the template may be quite large. This may cause deformation of the substrate and/or template, for example of a few hundred nanometers, which may lead to damage of the pattern imprinted on the substrate.

In general, a considerable amount of time is allowed to lapse once an imprint template has been brought into contact with the imprintable material of a substrate. This is to allow the imprintable material to fully flow into all of the recesses of the pattern of the template. This considerable time period is one reason why imprint lithography is currently slower than optical lithography. Speed is an important factor in the economic viability of imprint lithography machines, and the considerable time allowed for the fluid to flow into the template may be a disadvantage.

3. SUMMARY

According to a first aspect, there is provided a lithographic apparatus, comprising:

a template holder configured to hold an imprint template;

a substrate table arranged to receive a substrate;

a radiation output arranged to illuminate a part of the imprint template; and a detector configured to detect radiation scattered from an interface between the imprint template and imprintable material provided on the substrate.

According to a second aspect, there is provided a lithographic apparatus, comprising:

a template holder configured to hold an imprint template;

a substrate table arranged to receive a substrate;

a radiation output arranged to illuminate a part of the imprint template; and a detector configured to detect radiation reflected by the substrate.

According to a third aspect, there is provided a method of imprint lithography, comprising:

pressing an imprint template onto a layer of imprintable material on a substrate;

illuminating a part of the imprint template with radiation; and detecting radiation scattered from an interface between the imprint template and the imprintable material on the substrate.

According to a fourth aspect, there is provided a method of imprint lithography, comprising:

pressing an imprint template onto a layer of imprintable material on a substrate;

illuminating a part of the imprint template with radiation; and detecting radiation reflected by the substrate.

One or more embodiments of the invention are applicable to any imprint lithography process in which a patterned template is imprinted into an imprintable medium in a flowable state, and for instance can be applied to hot and UV imprint lithography as described herein.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 3:
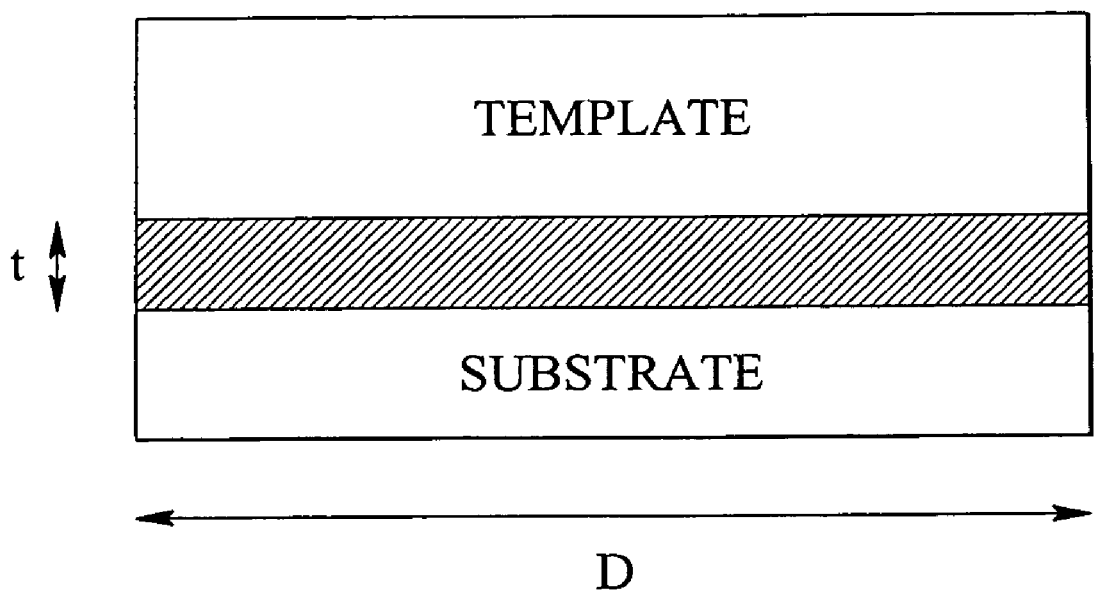
Figure 4:
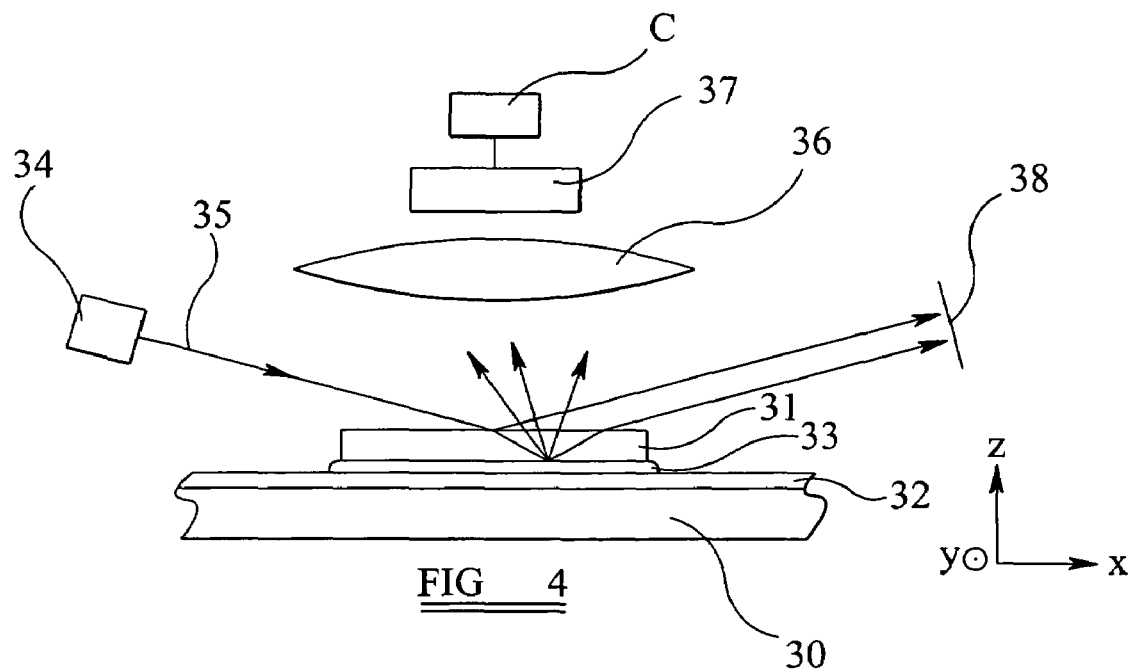
Figure 5A:
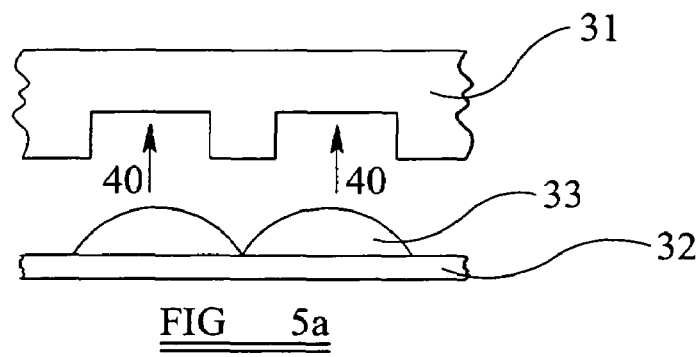
Figure 5B:
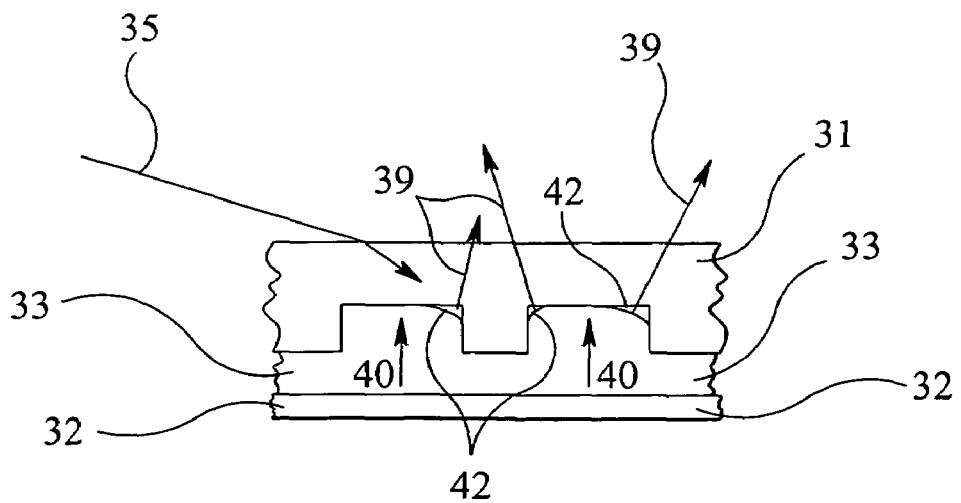
Figure 5C:
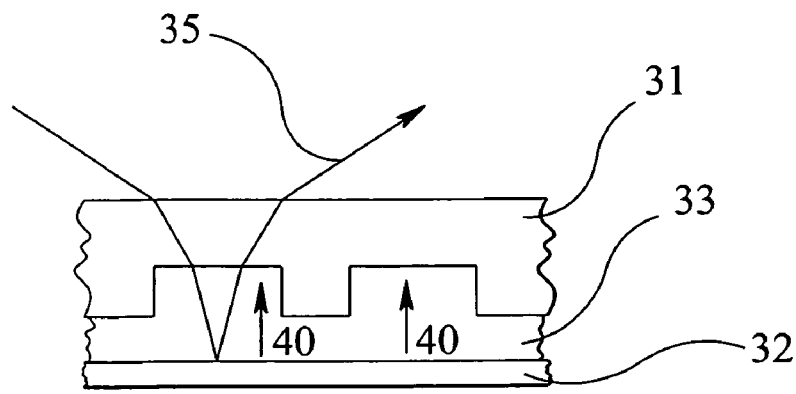
Figure 6:
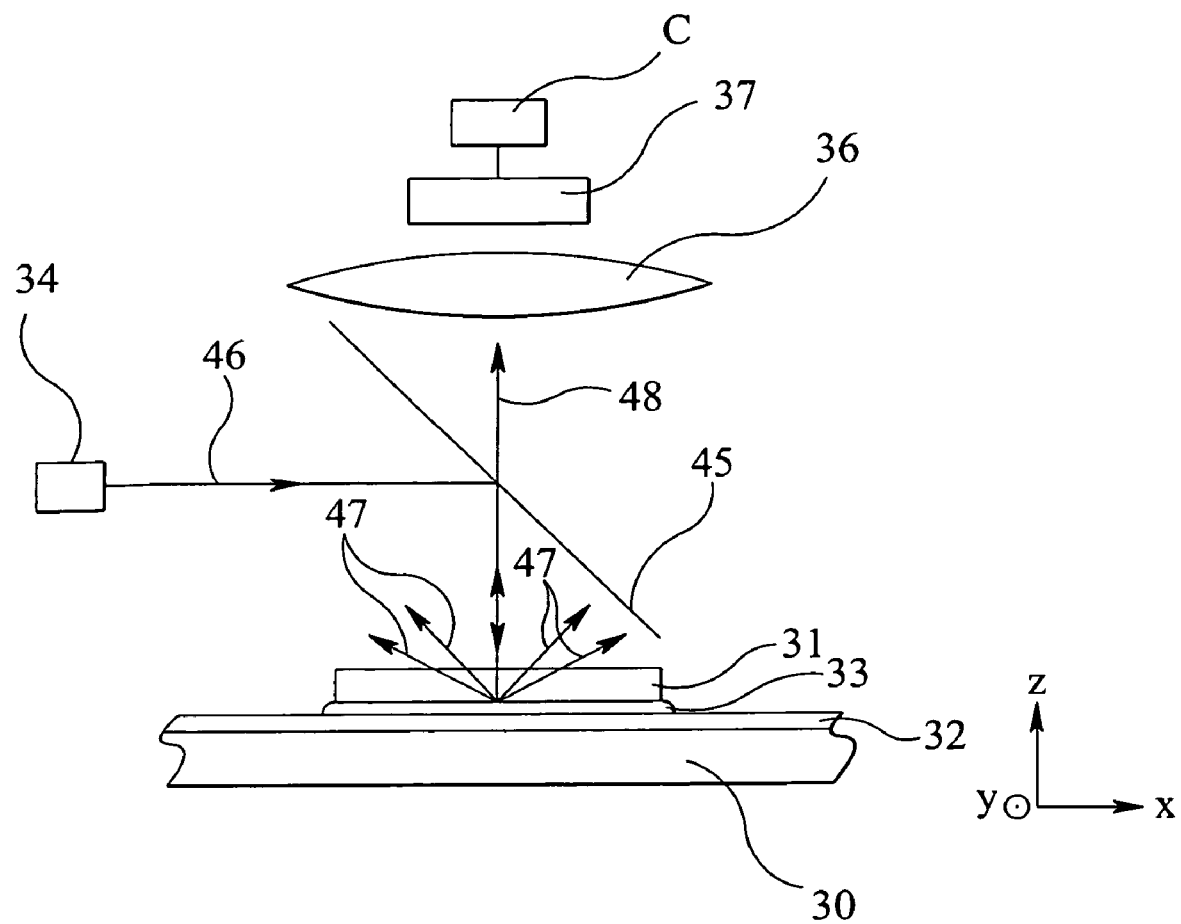

FIG. 3 schematically illustrates a template and a typical imprintable resist layer deposited on a substrate;

FIG. 4 schematically illustrates an imprint lithography apparatus according to an embodiment of the invention;

FIG. 5a-5c schematically depict details of the imprint template and substrate shown in FIG. 4; and FIG. 6 schematically illustrates an imprint lithography apparatus according to another embodiment of the invention.

5. DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
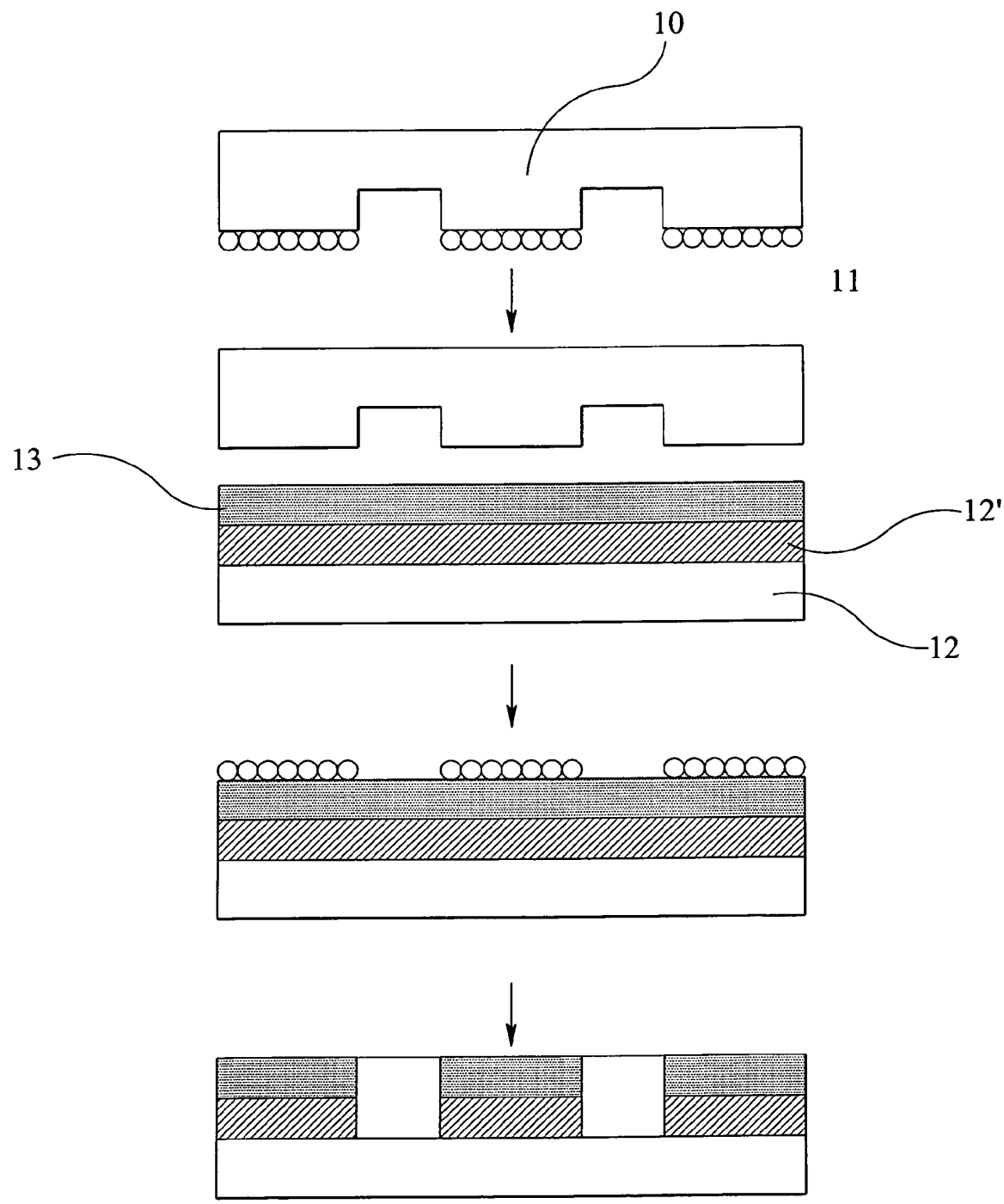
FIG. 1a-1c illustrate examples of conventional soft, hot and UV lithography process respectively.
Figure 1B:
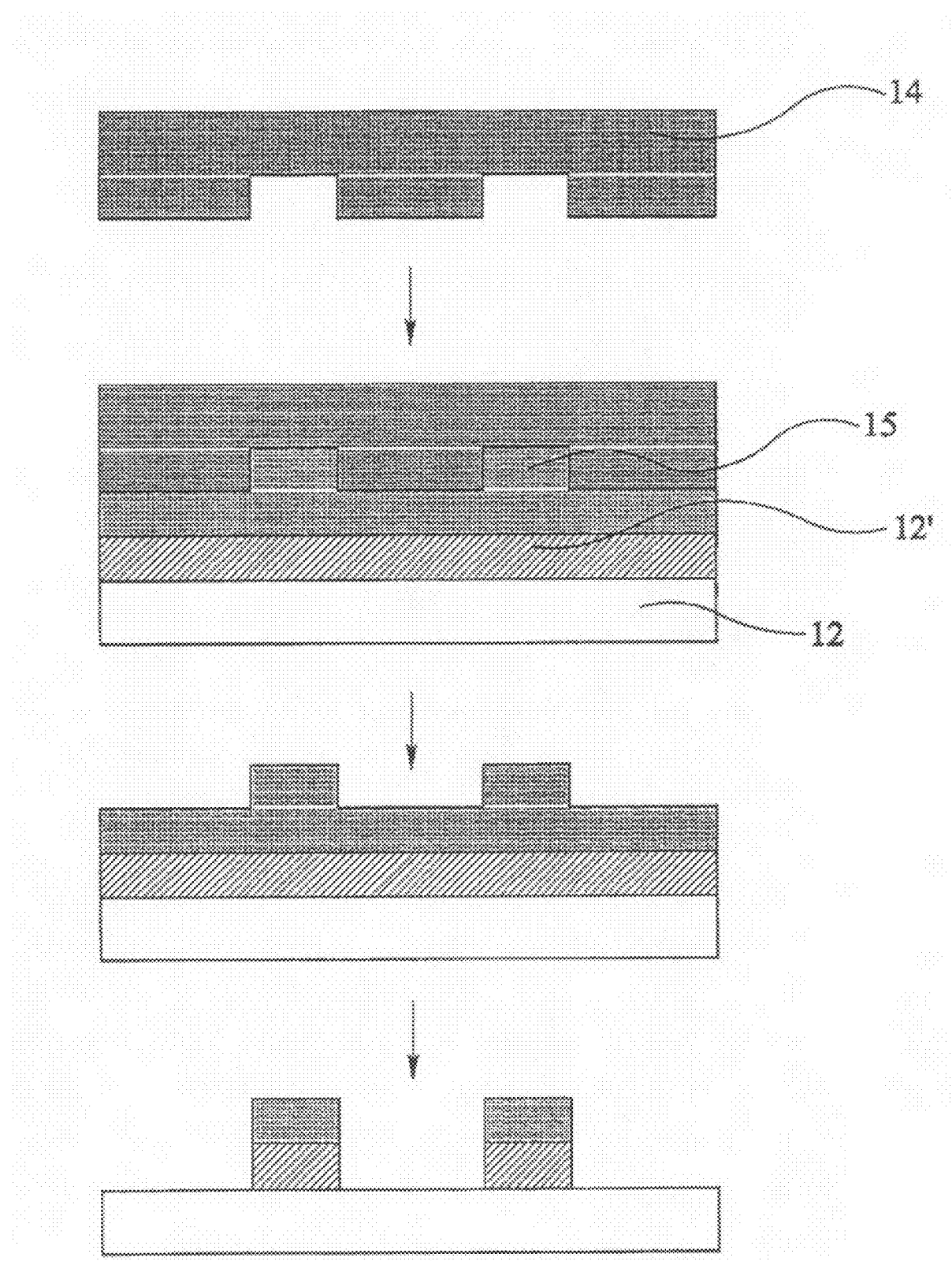
Figure 1C:
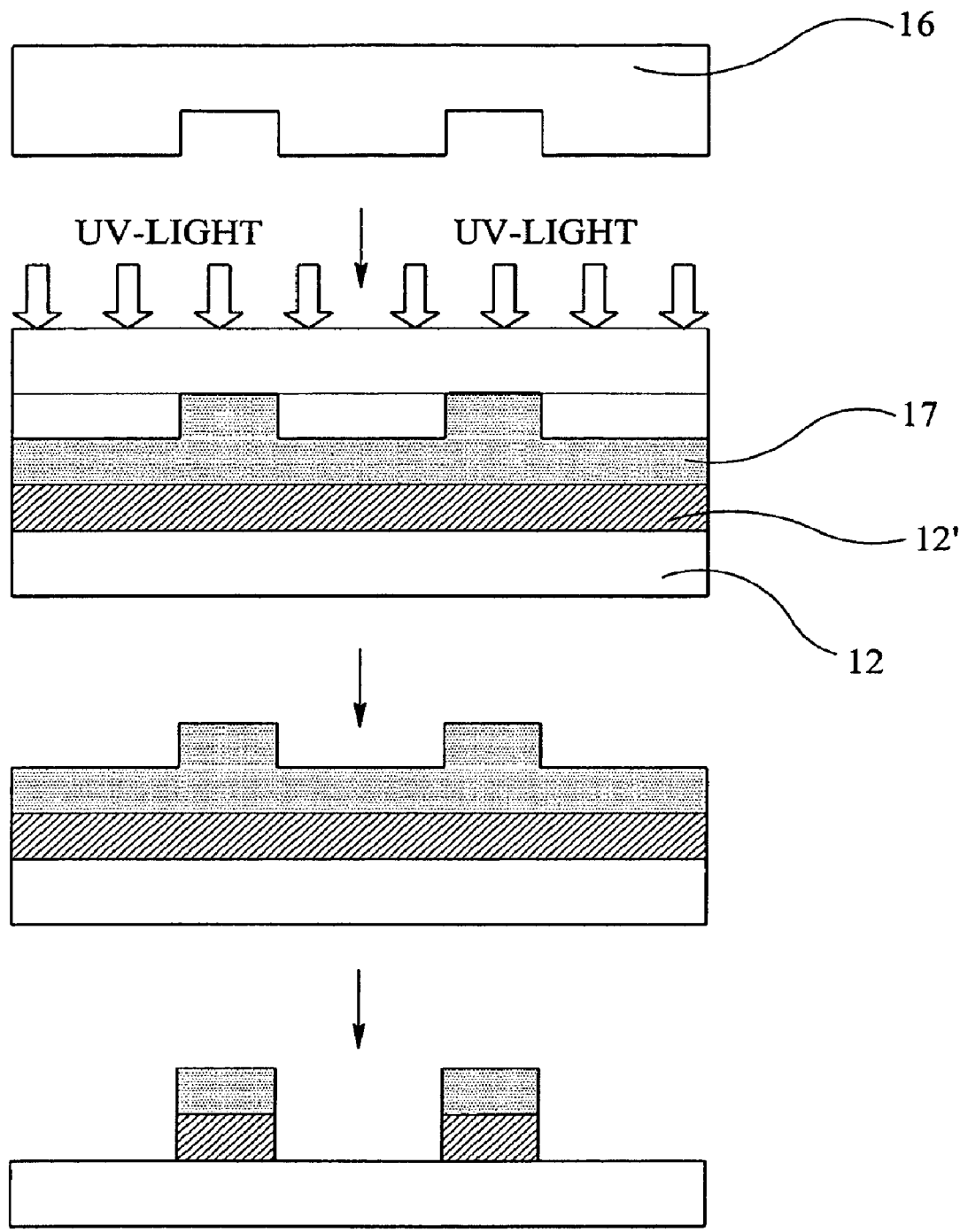

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly(methyl methacrylate), polystyrene, poly(benzyl methacrylate) or poly(cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
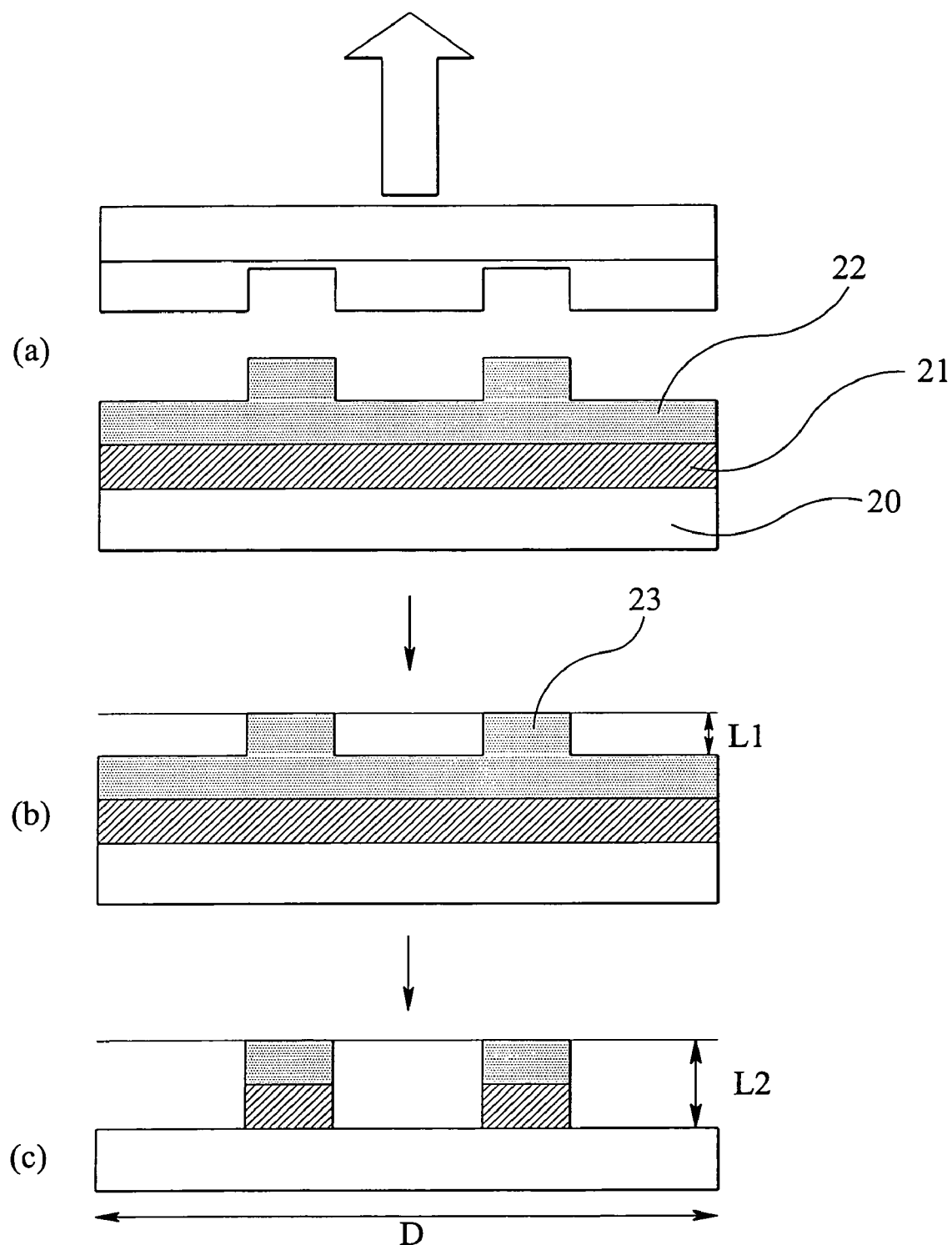
FIG. 2a-2c illustrate a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used.

Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing'. UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the invention.

FIG. 4 shows schematically an imprint lithography apparatus which comprises a substrate table 30 and a template holder (not shown for ease of illustration and clarity) holding an imprint template 31. A substrate 32 is held on the substrate table 30, and is provided with a region of imprintable material 33. Only part of the substrate table 30 and substrate 32 are shown in FIG. 4 for ease of illustration.

The imprint template 31 is movable in the z-direction (standard Cartesian coordinates are marked on FIG. 4), from a disengaged position in which it is not in contact with the imprintable material 33, to an imprint position in which the imprint template 31 is pressed into the imprintable material 33. When the imprint template 31 is in the imprint position, it causes the imprintable material 33 to flow into recesses which form a pattern on the imprint template (the recesses are not shown in FIG. 4). The pattern on the imprint template 31 is thereby transferred to the imprintable material 33.

The imprintable material 33 is illustrated as extending just beyond edges of the imprint template 31. In an arrangement, the imprintable material may be provided across the entire upper surface of the substrate 32.

A light emitting diode (LED) with a radiation output 34 is provided to one side of the imprint template 31, and is arranged to emit radiation at a wavelength of 400 nanometers in the direction of the imprint template. Alternatively or additionally, radiation may be supplied to a radiation output 34 from a remote radiation source. In an embodiment, A beam stop 38 is provided on an opposite side of the imprint template 31, and is arranged to trap radiation reflected by the imprint template 31 and the substrate 32. A condensing lens 36 is located above the imprint template 31, and is arranged to focus an image of the imprint template 31 onto a charge coupled device (CCD) camera 37.

In use, once the imprint template 31 has been moved to the imprint position, i.e. it is pressing into the imprintable material 33, the LED 34 is switched on and directs a beam of radiation 35 at an upper surface of the imprint template 31. The beam of radiation 35 passes through the imprint template 31, is reflected from the surface of the substrate 32, passes back through the imprint template and is incident upon the beam stop 38. Part of the radiation beam 35 is scattered at an interface between the imprint template 31 and the imprintable material 33. The scattered radiation, which is represented by arrows 39, is condensed by the condenser lens 36 onto the CCD camera 37. The scattered radiation 39 is used to determine whether the imprintable material 33 has fully flowed into the recesses which form the pattern on the underside of the imprint template 31.

FIGS. 5a-5c schematically depict details of the imprint template and substrate shown in FIG. 4. Referring first to FIG. 5a, the imprint template 31 is in the disengaged position and is located above the substrate 32. The substrate 32 is provided with imprintable material 33. The imprintable material 33 is in the form of two droplets, rather than a continuous layer of equal depth. Droplets of imprintable material 33 often occur due to the surface tension of the imprintable material. Indeed, it is often the case that the imprintable material 33 is deliberately provided in droplets, for example in a configuration which is believed to speed up the imprint process. The droplets of imprintable material 33 are shown as having similar dimensions to recesses 40 which form the pattern on the underside of the imprint template. However, this is for ease of illustration only, and in practice the droplets of imprintable material 33 are usually much larger than the recesses 40.

In FIG. 5b, the imprint template 31 has been moved to the imprint position and is pressing onto the imprintable material 33. Over time, this pressure forces the imprintable material 33 to flow into recesses 40 in the underside of the imprint template 31. Once this flow has been completed, the imprintable material 33 fills all of the recesses 40 fully, with the result that when the imprint template 31 is moved to the disengaged position, a pattern formed by the recesses 40 on the underside of the imprint template is retained by the imprintable material 33. FIG. 5b shows an intermediate point in the flow. At this intermediate point, the imprintable material 33 has not fully filled the recesses 40 of the imprint template 31, and regions of gas 42 (gas bubbles) remain in the recesses.

The beam of radiation 35 undergoes scattering when it intercepts the interface between the gas bubbles 42 and their surroundings. As in FIG. 4, the scattered radiation is represented by arrows 39. The scattered radiation 39 is imaged onto the CCD camera 37, and indicates that the flow of the imprintable material 33 has not been completed.

The reason why the scattering occurs can be understood with reference to the refractive index of the gas 42 as compared to the refractive indices of the imprint template 31 and the imprintable material 33. A typical refractive index for the gas 42, which may be for example nitrogen or air, is 1. A typical refractive index of the imprint template 31, which conventionally is made from quartz, is 1.9. A typical refractive index of the imprintable material 33, which typically comprises silicon containing a monomer, is 1.6. Reflection of radiation occurs at the interface between two materials when there is significant difference between the refractive indices of those two materials. Thus, the beam of radiation 35 will undergo reflection when it reaches an interface between the imprint template 31 and a gas bubble 42, and an interface between the gas bubble 42 and the imprintable material 33. Because there are several interfaces, and these are disposed at different angles, many reflections will occur, and these give rise to the scattered radiation 39. The scattering of radiation from the gas bubbles 42 is detected by the CCD camera 37 (see FIG. 4). To avoid complicating FIG. 5b, the passage of the beam of radiation 35 into the gas bubbles 42 is not illustrated.

Referring to FIG. 5c, once the flow of imprintable material 33 has been completed, the recesses 40 are substantially completely filled with imprintable material, and no or few gas bubbles are present. Since the refractive index of the imprint template 31 is close to the refractive index of the imprintable material 33, the amount of reflection which occurs at the interface between the imprint template and the imprintable material is low. The beam of radiation 35 passes through the interface without being substantially disturbed; significant scattering does not occur, and therefore little or no scattered radiation is detected by the CCD camera 37 (see FIG. 4). In some instances, a residual amount of radiation may be scattered at the interface due to the relatively small difference between the refractive index of the imprint template and the refractive index of the imprintable material. However, this will be small compared with the amount of radiation that would be scattered by the presence of the gas bubbles.

In general, the degree of scattering detected by the CCD camera 37 provides an indication of the number and/or size of gas bubbles 42 located underneath the imprint template 31.

In an embodiment, a measurement of the point in time at which the flow of imprintable material 33 into recesses 40 of the imprint template 31 has been completed may be made. This measurement may be done automatically, for example by analyzing the total intensity of the image detected by the CCD camera 37, or the contrast of the image seen by the CCD camera. This may allow imprint lithography to be performed more efficiently, since the imprint template 31 may be moved to the disengaged position immediately once the flow of imprintable material 33 has been completed. In typical imprint lithography, it may not be known when the flow of imprintable material had been completed, with the result that the imprint template remained in the imprint position for longer than was necessary. Thus, a reduction in the time required to perform imprint lithography, correspondingly an increase in the productivity of imprint lithography, may be achieved.

Further, in an embodiment, an indication of the presence of a defect in an imprinted pattern may be provided. For example, it may be the case that bubbles are trapped beneath the imprint template, and have not migrated out from under the template within a maximum time allowed for the flow of imprintable material. These bubbles may cause defects in the imprinted pattern. By detecting the presence of the bubbles, an embodiment allows a defective imprinted pattern to be identified. The defective imprinted pattern may be, for example, reworked or discarded. In conventional imprint lithography systems, defective patterns may not be identified until manufacture of a device has been completed, and the device tested.

Following the completion of the flow of the imprintable material 33, the imprint template 31 is returned to the disengaged position. The imprintable material 33 is then illuminated with UV radiation in order to activate a chemical reaction which fixes the imprinted pattern into the imprintable material 33 (i.e. the imprintable material is cured). In an embodiment, the CCD camera 37 and condenser lens 36 are movable in the x and/or y directions, and are moved away from the imprint template 31 before illumination by UV radiation takes place. In an embodiment, the CCD camera 37 and/or condenser lens 36 are transparent to UV radiation, and the UV radiation is directed through one or both of them to the imprintable material 33. In an embodiment, the UV radiation may be directed at the imprintable material 33 at an angle, so that the CCD camera 37 does not need to move or to be transparent to UV radiation. In an embodiment (not illustrated), the CCD camera may be placed such that it views the imprint template from an angle instead of being substantially perpendicular, to allow substantially perpendicular illumination of the imprint template by the UV radiation.

As mentioned above, the output of the CCD camera 37 may be analyzed automatically. This may be done, for example, by adding together the entire output of the CCD camera 37 to provide a single intensity value. A controller C may be arranged to compared this intensity value with a threshold value, and when the single intensity value falls below the threshold value this may be interpreted as indicating that the flow of imprintable material 33 has been completed. The controller C will then provide an output signal indicating that the imprint template 31 may be moved to the disengaged position. It will be appreciated that for this arrangement the CCD camera 37 may be replaced by a single large area photodiode.

In an arrangement, the controller C may be used to analyze the contrast of the image detected by the CCD camera 37 (i.e. the difference in intensity seen by different pixels of the camera). Radiation scattered from gas bubbles will be unevenly distributed and will not provide an even intensity over the CCD camera 37. This means that the amount of contrast is an indication of the number and/or size of gas bubbles 42 that are trapped beneath the imprint template 31. Once the scattering has been eliminated, or substantially reduced, then what will be left is some background illumination of the CCD camera 37, which will be substantially uniform. Thus, when the contrast falls below a threshold value, this may be interpreted as indicating that the flow of imprintable material 33 has completed. The controller C will then provide an output signal indicating that the imprint template 31 may be moved to the disengaged position.

In general, it may be the case that not every gas bubble 42 can be eliminated by the flow of imprintable material 33. The threshold may therefore be set to a level such that it indicates that the majority of gas bubbles 42 have been eliminated, or a value which is found to correspond with imprinted patterns that have the required form (i.e. that are not overly damaged by the presence of gas bubbles).

Referring to FIG. 6, an imprint lithography apparatus according to an embodiment of the invention is schematically depicted. The imprint lithography apparatus comprises a substrate table 30 and a template holder (not shown for ease of illustration and clarity) holding an imprint template 31. A substrate 32 is held on the substrate table 30 and is provided with a region of imprintable material 33. The imprint template 31 is movable in the z-direction. A LED with a radiation output 34 is provided to one side of the imprint template 31, and is arranged to emit radiation at a wavelength of 400 nanometers in the direction of a beam splitter 45. Alternatively or additionally, radiation may be supplied to a radiation output 34 from a remote radiation source. The beam splitter 45 is arranged to direct radiation from the LED 34 towards the imprint template 31. A condensing lens 36 is located above the beam splitter 45 and is arranged to focus an image of the imprint template 31 onto a CCD camera 37.

In use, once the imprint template 31 has been moved to the imprint position, the LED 34 is switched on and directs a beam of radiation 46 via the beam splitter 45 at an upper surface of the imprint template. When gas bubbles are present between the imprint template 31 and the imprintable material 33, scattering of the beam 46 will occur, as illustrated by arrows 47. In general, the scattered radiation 47 is not condensed by the condenser lens 36, and therefore is not detected by the CCD camera 37.

Once the flow of imprintable material 33, into recesses of the imprint template 31 has been completed, there will be no or a reduced number of gas bubbles present at the interface between the imprint template and the imprintable material. The beam of radiation 46 will therefore no longer be substantially scattered, but will instead be reflected from the upper surface of the substrate 32, as shown by arrow 48. The reflected radiation is condensed by the condenser lens 36, and is detected by the CCD camera 37.

The presence of, and amount of, radiation detected at the CCD camera 37 provides an indication of whether the flow of imprintable material 33 into recesses of the imprint template 31 has been completed. The measurement provided by the CCD camera 37 is opposite to that provided in the embodiment illustrated in relation to FIGS. 4 and 5, in the sense that the presence of gas bubbles reduces the amount of radiation detected by the CCD camera 37 (in the previously described embodiment the presence of gas bubbles increased the amount of detected radiation). Thus, the CCD camera 37 may be interpreted as indicating that the flow of imprintable material 33 has been completed when the total intensity output from the CCD camera 37 rises above a threshold value. When the output from the CCD camera 37 rises above the threshold value, a controller C provides an output signal indicating that the imprint template 31 may be moved to the disengaged position. Where a single total intensity output is used, the CCD camera 37 may be replaced by a single large area photodiode.

In an arrangement, the contrast of radiation detected by the CCD camera 37 may be used to obtain an indication of when the flow of imprintable material 33 has been completed. Reflection of the beam of radiation 46 from the surface of the substrate 32, together with reflection which may also be seen from the surface of the imprint template 31, will lead to substantially uniform illumination of the CCD camera 37 (i.e. the contrast will be low). However, during flow of the imprintable material 33, when gas bubbles are present between the imprint template 31 and the imprintable material 33, the majority of radiation incident on the imprint template and the imprintable material will be scattered, and the amount of radiation that is reflected will be small. Although most of the scattered radiation is not incident on the CCD camera 37, the small amount that is incident on the CCD camera is significant compared to the amount of reflected radiation incident on the CCD camera. Thus, the scattered radiation will give rise to an uneven distribution of radiation on the CCD camera 37, i.e. a significant amount of contrast. When the flow of imprintable material 33 has been completed, the amount of reflected radiation is greater, and the amount of scattered radiation is reduced, and this is seen as a reduction of the contrast of radiation incident on the CCD camera 37. Thus, when the contrast seen by the CCD camera 37 falls below a threshold value, this may be interpreted by the controller C as indicating that the flow of imprintable material 33 has been completed. The controller C will then provide an output signal indicating that the imprint template 31 may be moved to the disengaged position.

A proportion of the beam of radiation 46 will pass through the beam splitter 45, and a proportion of the beam of radiation 48 will be reflected by the beam splitter. The unwanted beams are directed at beam stops (not illustrated) which are arranged to absorb the beams without reflecting them. In some instances suitable polarizing plates may be used in conjunction with a polarizing beam splitter to minimize the amount of energy in the unwanted beams, or even to substantially eliminate the unwanted beams.

In the described embodiments, for ease of illustration the beam of radiation 35, 46 is shown as only intersecting a small portion of the imprint template 31. It will be appreciated that in practice the beam of radiation 35, 46 may be sufficiently broad to illuminate the entire imprint template. In some instances it may be desired to illuminate and measure only a part of the imprint template 31. Where this is done, the measurement may be interpreted as being representative of the entire imprint template 31.

In the described embodiments, the output of the CCD camera 37 is compared with a threshold value for the entire surface of the CCD camera. It will be appreciated that in an arrangement, the output of the CCD camera may be considered as set of adjoining areas (for example nine equally sized rectangles). Where this is done, the output for each area may be separately compared with a threshold value. This provides spatial information regarding the location of areas in which the flow of imprintable material is incomplete. This information may be used to improve the imprint process. For example, once an area for which the flow of imprintable material is incomplete has been located, extra imprint pressure may be applied to that area.

Although the LED 34 is arranged to emit radiation at 400 nanometers, other suitable wavelengths or bands of wavelengths may be used. Furthermore, radiation sources other than an LED may be used. In general, the wavelength used should be long enough that it will not cause curing of the imprintable material, but short enough that it will scatter from small gas bubbles (i.e. bubbles that are significantly smaller than the size of features on the imprint template). A suitable range of wavelengths of radiation is 400 to 700 nanometers. In an embodiment, infrared radiation is not used, as this may be absorbed by the imprintable material or the substrate and cause unwanted heating.

The described embodiments may be used in connection with conventional imprintable material, for example a photo-polymerizable material such as a mixture of monomers, an initiator and silicon. Typically the monomer may comprise for example acrylate or methacrylate. If required, the refractive index of the imprintable material may be increased by increasing the proportion of silicon in the material. This will reduce the refractive index difference between the imprint template 31 and the imprintable material 33, thereby improving the operation. The refractive indices of the imprint template 31 and the imprintable material 33 may be adjusted so that they are matched (i.e. substantially identical). An another way of reducing the refractive index difference between the imprint template 31 and the imprintable material 33 is to make the imprint template from a material having a lower refractive index. One material that could be used to do this is plastic. However, plastic may become damaged over time due to exposure to ultraviolet radiation.

In order to increase the proportion of the beam of radiation 35, 46 that provides a useful signal, an anti-reflection coating for the wavelength of the beam of radiation may be provided on an uppermost surface of the imprint template 31.

While specific examples of the invention have been described above, it will be appreciated that the invention may be practiced otherwise than as described. The description is not intended to limit the invention.

The invention claimed is:

1. A lithographic apparatus, comprising:
   a template holder configured to hold an imprint template;
   a substrate table arranged to receive a substrate;
   a detector configured to detect radiation scattered from an interface between the imprint template and imprintable material provided on the substrate when at least part of the template is in contact with the imprintable material; and
   a controller configured to compare the contrast of radiation incident on the detector with a threshold, and generate an output when the contrast falls below the threshold.

2. The apparatus according to claim 1, wherein the detector comprises a charge coupled device (CCD) camera or one or more photodiodes.

3. The apparatus according to claim 1, further comprising a radiation output configured to direct UV radiation at the imprintable material at an angle, such that the UV radiation is not incident upon the detector.

4. The apparatus according to claim 1, wherein the detector is translatable.

5. The apparatus according to claim 1, wherein the detector is arranged to generate a plurality of outputs, each output representing a different area of the detector.

6. The apparatus according to claim 1, further comprising a radiation output arranged to illuminate a part of the imprint template and arranged to supply radiation at a wavelength or a band of wavelengths within the range 400 to 700 nanometers.

7. The apparatus according to claim 1, further comprising a radiation output arranged to illuminate a part of the imprint template and arranged to direct radiation at the imprint template such that the radiation is incident at an angle upon the imprint template, the angle being sufficiently large that radiation reflected from the substrate is not incident upon the detector.

8. The apparatus according to claim 1, wherein the refractive index of the imprintable material and the refractive index of the imprint template are substantially matched.

9. The apparatus according to claim 1, comprising a beam splitter located between the detector and the imprint template.

10. The apparatus according to claim 1, wherein an uppermost surface of the imprint template is provided with an anti-reflection coating which is effective at the wavelength or band of wavelengths of radiation emitted from the radiation output.

11. A method of imprint lithography, comprising:
pressing an imprint template onto a layer of imprintable material on a substrate;
illuminating a part of the imprint template with radiation; and
detecting radiation scattered from an interface between the imprint template and the imprintable material on the substrate to determine whether the imprintable material has flowed into a recess of the imprint template; and
comparing a contrast of the detected radiation with a threshold, and generating an output when the contrast falls below the threshold.

12. The method according to claim 11, wherein the refractive index of the imprintable material and the refractive index of the imprint template are substantially matched.

13. The method according to claim 11, wherein the illuminating comprises directing UV radiation at the imprintable material at an angle, such that the UV radiation is not incident upon a detector used for the detecting.

14. The method according to claim 11, further comprising moving a detector used for the detecting.

15. The method according to claim 11, wherein the illuminating comprises directing radiation at the imprint template such that the radiation is incident at an angle upon the imprint template, the angle being sufficiently large that radiation reflected from the substrate is not incident upon a detector used for the detecting.

16. The method according to claim 11, wherein an uppermost surface of the imprint template is provided with an anti-reflection coating which is effective at the wavelength or band of wavelengths of radiation emitted during the illuminating.

* * * * *